United States Patent [19]

Browne

[11] 4,231,153

[45] Nov. 4, 1980

[54] ARTICLE PLACEMENT SYSTEM

[76] Inventor: Lawrence T. Browne, 690 El Rancho Rd., Santa Barbara, Calif. 93108

[21] Appl. No.: 13,818

[22] Filed: Feb. 22, 1979

[51] Int. Cl.³ .................... B23P 19/00; B23P 21/00
[52] U.S. Cl. ..................................... 29/739; 29/742; 29/759
[58] Field of Search ................. 29/739, 740, 741, 742, 29/743, 759, 771, 783, 791, 822, 823

[56] References Cited

U.S. PATENT DOCUMENTS

| | | | |
|---|---|---|---|
| 2,896,314 | 7/1959 | Godwin et al. | 29/741 X |
| 3,508,315 | 4/1970 | Hoffken | 29/741 X |
| 3,710,479 | 1/1973 | Bernardo et al. | 29/741 |
| 3,722,062 | 3/1973 | Gharaibeh | 29/783 X |
| 3,727,284 | 4/1973 | Ragard et al. | 29/741 X |
| 3,740,817 | 6/1973 | Weiler et al. | 29/742 X |
| 3,808,662 | 5/1974 | Ragard | 29/739 X |

FOREIGN PATENT DOCUMENTS 434634  11/1974  U.S.S.R. ................................... 29/739

Primary Examiner—Ervin M. Combs
Attorney, Agent, or Firm—Donald D. Mon

[57] ABSTRACT

An article placement system for applying a plurality of articles to a substrate, each article placed in a different location and perhaps at a different angular orientation on said substrate. The system includes a base with a walking beam mounted to the base which has an axis of bi-directional movement, and a direction of length along the axis. A plurality of article transfer members is mounted to the walking beam at axially spaced-apart locations from one another. Conveyor means extends axially beneath the article transfer means for conveying substrates to positions beneath successive ones of the article transfer means. A plurality of article supply members is mounted to the base. Each has a respective delivery point where it provides an article to a respective one of the article transfer means. Positioning means is provided for locating the article transfer members and the article supply members relative to each other to provide for selectively adjustable placement of the articles. The conveyor means is stepped intermittently beneath the article transfer members which oscillate as a group with the walking beam to pick up an article and deposit it on a respective substrate.

13 Claims, 10 Drawing Figures

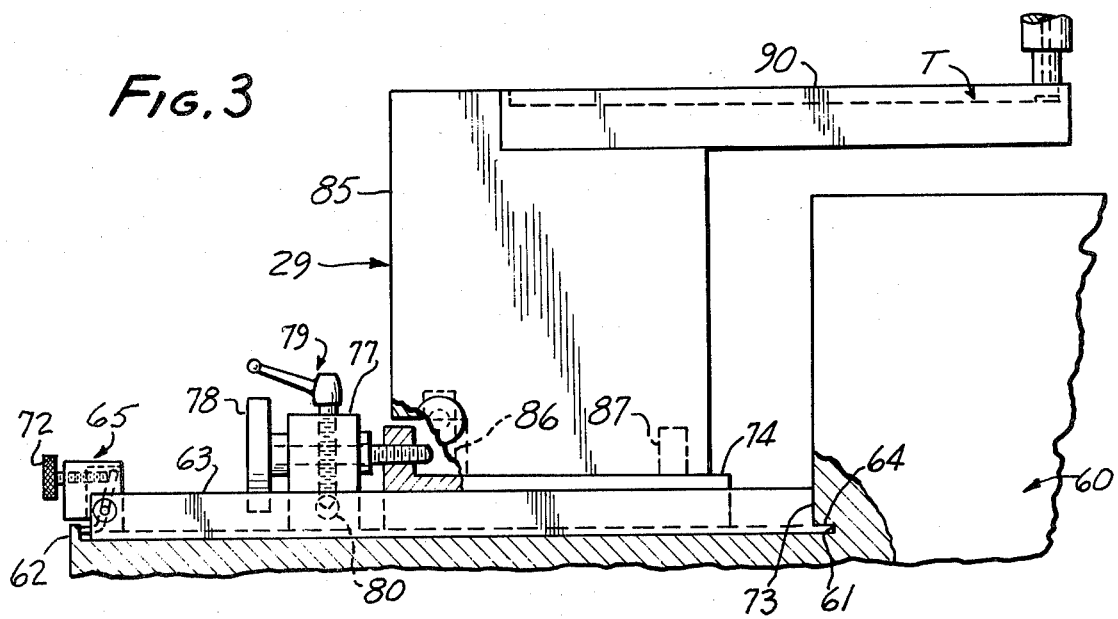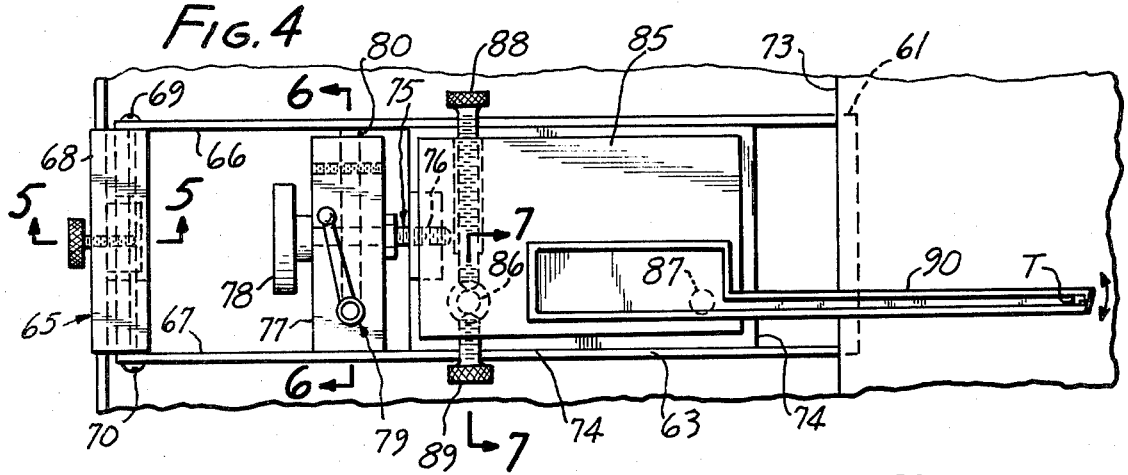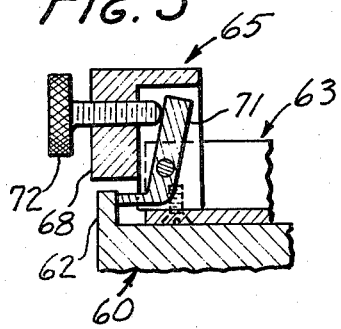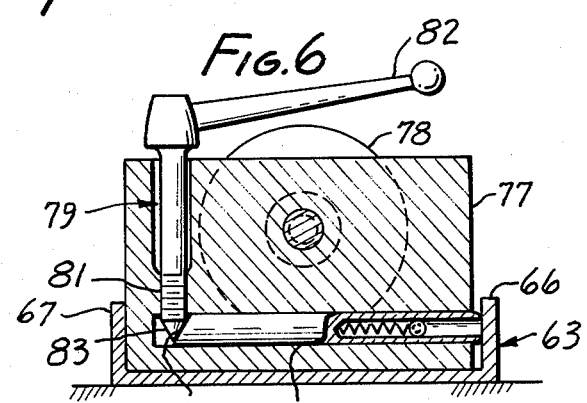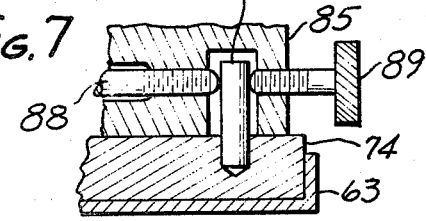

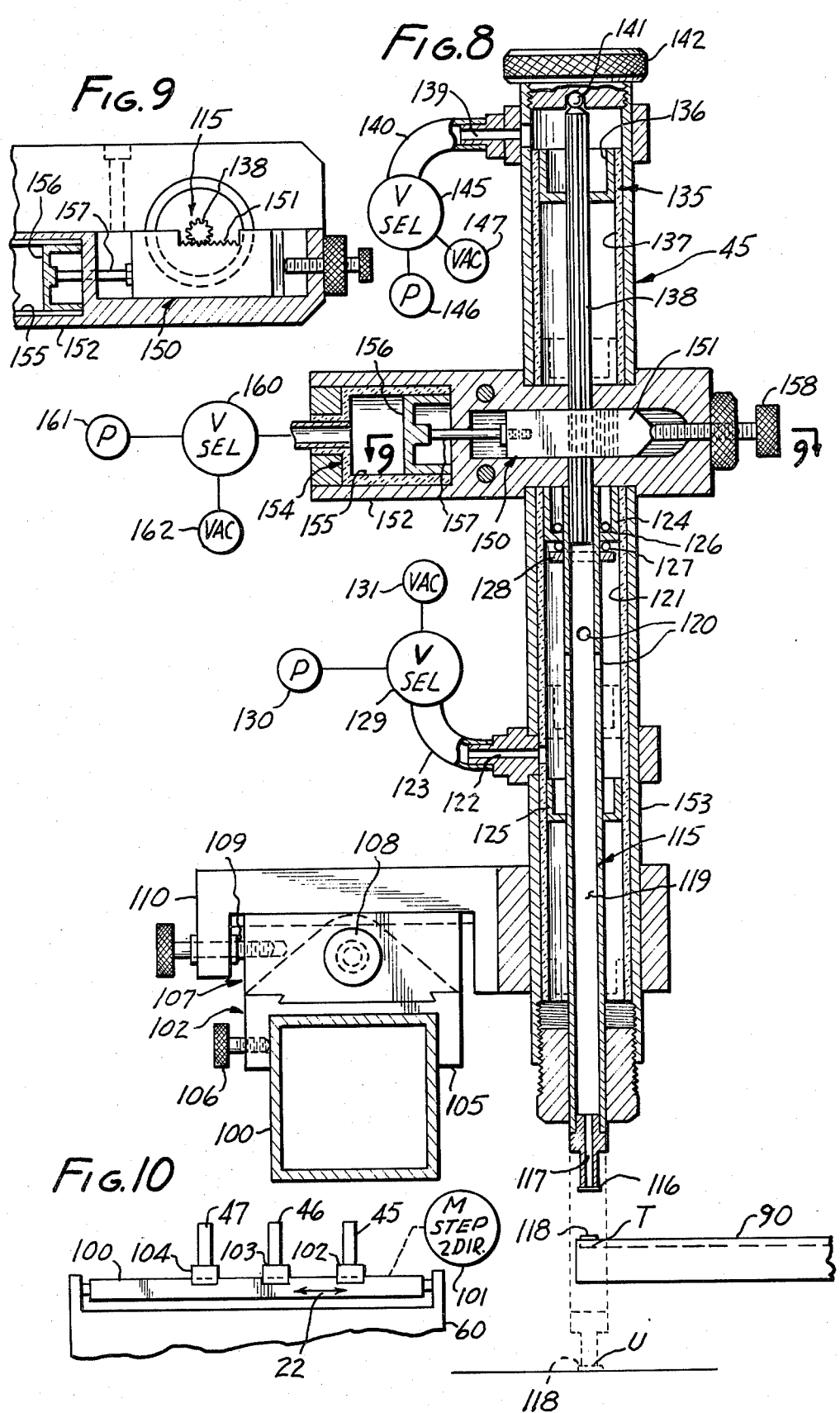

ARTICLE PLACEMENT SYSTEM

SPECIFICATION

This invention relates to an article placement system.

The purpose of this article placement system is to place upon a plurality of substrates a plurality of articles at different locations on the surface of said substrates.

BACKGROUND OF THE INVENTION

Especially in hybrid circuitry, it is conventional practice to apply articles such as electrical circuit components (resistors, capacitors, and the like) to the surface of a substrate, either manually or by complicated positioning devices which pick up one article after another, and by means of coordinate systems apply the article to a selected location on the substrate. This technique is quite useful for many applications, but studies by the inventor have established to his satisfaction that for many types of products, higher rates of production at lesser cost are available by the use of positioning mechanisms operated in a stepper mode from station to station. It is an object of this invention to provide an elegantly simple device for this purpose which is readily adjustable to provide wide assortments of articles at various positions on substrates, both as to coordinate position, and if desired also as to angular position.

BRIEF SUMMARY OF THE INVENTION

An article placement system according to this invention includes a base, a walking beam mounted to the base having an axis of bi-directional movement and a dimension of length along the axis. A plurality of article transfer members is mounted to the walking beam at axially spaced-apart locations from one another. Conveyor means extends axially beneath the article transfer means for conveying substrates to positions beneath successive ones of the article transfer means. The conveyor means is driven by stepper means which intermittently move the same. A plurality of article supply members is mounted to the base where each provides an article to a respective one of the article transfer means at a respective delivery point. Drive means bi-directionally moves the walking beam and thereby all of the article transfer means simultaneously by a unit distance, between a respective delivery point and respective deposit point and reversely. The stepper means intermittently operates to cause the conveyor means to move the substrates beneath successive deposit points, and the walking beam oscillates to move the article transfer means from the delivery point of the respective article supply members where they pick up articles to their respective deposit points where they deposit them, each substrate being treated at each deposit point.

According to a preferred feature of the invention, the article transfer members include the capacity to raise and to lower the articles.

According to a preferred but optional feature of the invention, positioning means is provided for the article supply members and for the article transfer members so as to adjust the coordinate position where the respective articles are picked up and deposited.

The above and other features of this invention will be fully understood from the following detailed description and the accompanying drawings, in which:

FIG. 3 is a side elevation, partly in cut-away cross-section, showing a part of the presently preferred embodiment of the invention;

FIG. 4 is a top view of FIG. 3;

FIGS. 5, 6 and 7 are cross-sections taken at lines 5—5, 6—6 and 7—7, respectively, in FIG. 4;

FIG. 8 is an axial cross-section showing an article transfer member suitable for use in this invention;

FIG. 9 is a cross-section taken at line 9—9 in FIG. 8; and

FIG. 10 is a schematic fragmentary elevation of a portion of the invention.

Figure 1:
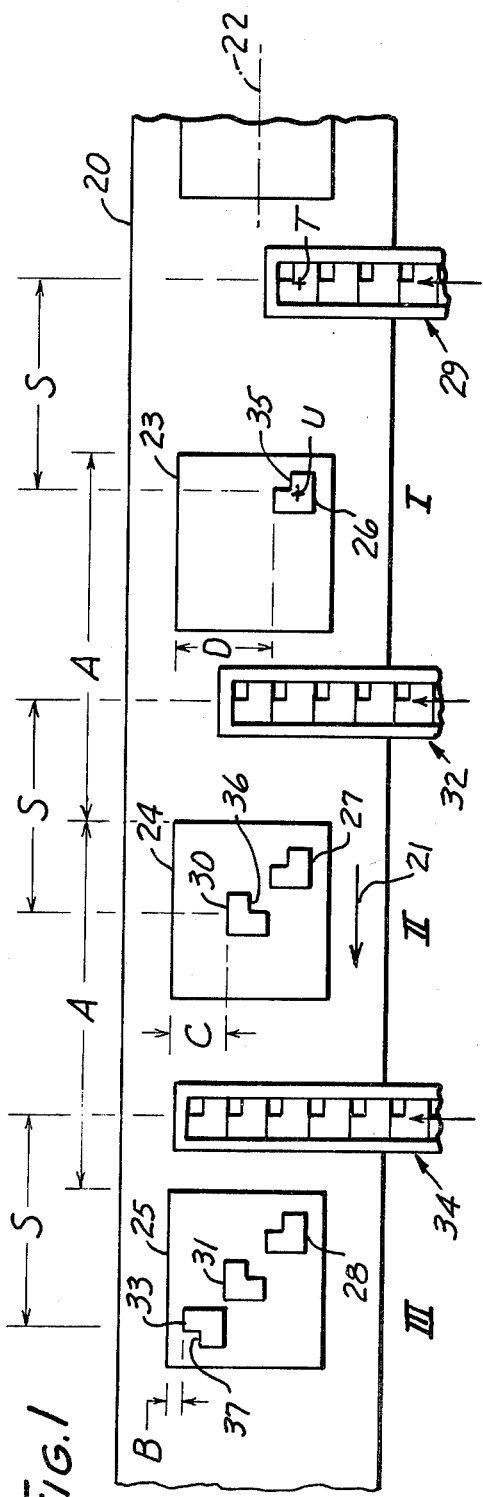
FIG. 1 is a plan view of a portion of the device showing its scheme of operation.
Figure 2:
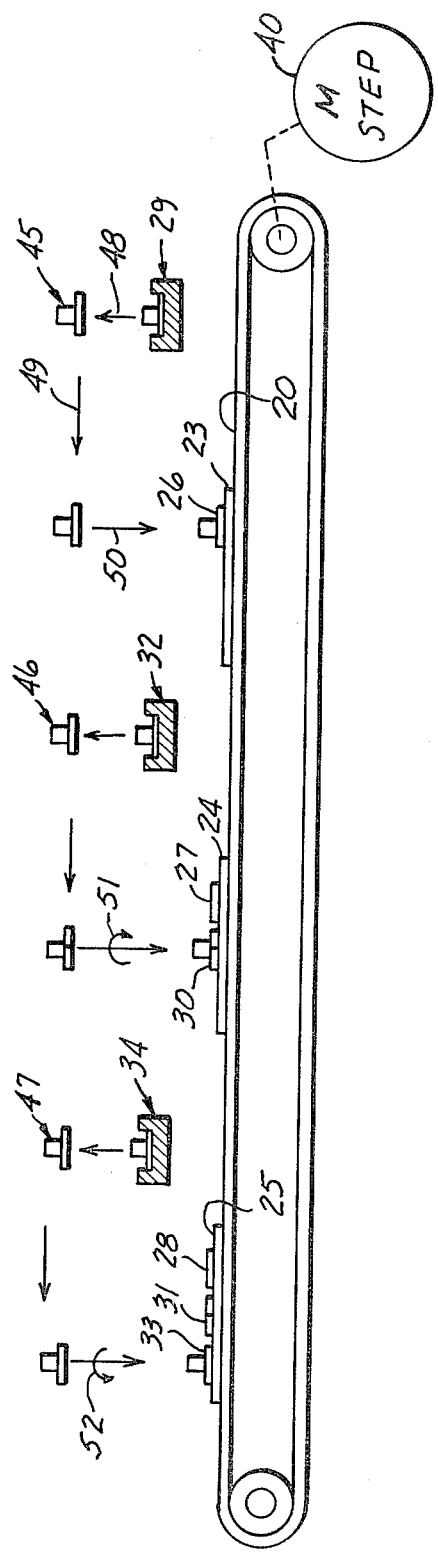
FIG. 2 is a side view of FIG. 1.

This invention can best be understood first by considering its scheme of operation, which is shown in FIGS. 1 and 2. In these figures conveyor means 20 in the form of a pusher bar or an endless conveyor belt is intermittently driven leftwardly in the direction of arrow 21 which is also along an axis 22. The purpose of the conveyor is to convey successive substrates of which three are shown, substrates 23, 24 and 25, to successive positions where they will receive respective articles. For example, articles 26, 27, 28 were provided by a first article supply member 29 at its station I. Articles 30, 31 were provided by article supply member 32 at station II. Article 33 was provided by article supply member 34 at station III.

There may be as many stations as desired on one machine, and not all need be used if the product does not require that many articles. A practical machine has been developed with five stations, and it is of course possible to process the same substrates in more than one machine or with later different settings of the same machine so as to apply more articles than the number of stations on one machine.

It will further be noticed that the articles have notches for the purpose of illustration. Notch 35 in article 26 is shown in the upper righthand corner. Notch 36 in article 30 is shown in the lower righthand corner. Notch 37 in article 33 is shown in the upper lefthand corner, these for the purpose of illustrating a possible angular positioning of the articles. It will be noted that all of the articles at the respective supply members are similarly oriented, for purposes of illustration.

The spacing A between stations is shown. It will be noted that this spacing is related to an edge of the respective substrates. Stepper means 40 advances the conveyor means by the spacing A each time a cycle is to be repeated. A transfer distance S is also shown. This is the distance between respective delivery points T where the article supply member delivers an article and the deposit point V where article transfer means yet to be described will deposit the same. It will be noted that the dimensions S is identical at every station. This is because article transfer members yet to be described are mounted to a common walking beam whose oscillation accomplishes this movement. It will also be seen that the location of the deposit point on the substrate depends on the location along the axis 22 of the article supply member and of the transfer members, so that the distance S terminates where the article is to be deposited. This is adjustable as will later be observed. It will also be observed that the upper edges of the respective articles are spaced by distances B, C and D from the upper edge of the substrate, and the respective delivery points of article supply members 34, 32 and 29 will be appropriately set. So will the deposit points of the respective article transfer members. The correct positioning of both the article supply members and of the article transfer members will later be described. For present purposes it will be sufficient to note that the actual place where the article is deposited is axially aligned with the delivery point in both coordinate directions.

Three article transfer members 45, 46, 47 are schematically shown merely by an indication of their pick up points in FIG. 2. Their mounting is not shown in detail in this Figure. Suffice it to say that the movement of the article transfer member is shown by an upward arrow 48 from the article supply member, a horizontal movement shown by arrow 49, and a downward movement shown by arrow 50 to the point of deposit on the substrate. Then the movement is reversed. This movement is concurrent and identical for all of the article transfer members. Rotational arrows indicate the rotational capability of the article transfer members to determine the angular position of the articles on the respective substrates.

With the foregoing functional description in mind, the specific construction now can profitably be considered. Because all of the article supply members are identical, only member 29 will be described in detail. It is shown in FIG. 3 attached to a base 60 of the system. The base includes an axially extending groove 61 and rail 62. A slide 63 includes a tongue 64 which fits in the groove and carries a lock 65 best shown in FIG. 5. The slide is U-shaped, with a pair of arms 66, 67. The lock includes a body 68 which is attached to the arms by screws 69, 70. A lever 71 is pivotally mounted to the body and engaged by a thumb screw 72. It will be seen that by tightening the thumb screw the tip of lever 71 is pushed against rail 62, and that this pushes the slide firmly against a shoulder 73 on the base and thereby locks the slide in location. This is a coarse adjustment for the position of the article supply member.

Within the channel formed by the slide there is a body 74 which is slideable therein. This sliding movement is accomplished by a lead screw member 75 threaded into a threaded port 76 in body 74. The lead screw member in turn is threaded through a block 77 and is provided with a thumb screw 78. Block 77 is locked in place by lock 79 which is best shown in FIGS. 4 and 6. This lock includes a plunger 80 which is laterally movable against arm 66 by a lock screw 81 having a handle 82 and a tapered tip 83 which jams against a tapered shoulder 84 on plunger 80. Tightening the screw will move the plunger firmly against the rail, also pressing the body 74 against the rail 66 and thereby holding the lock in place. Now turning the lead screw member will move body 74 to the right or left in FIG. 4 to provide a fine adjustment of position. Chassis 85 of the article transfer member is mounted to body 74 by means of two pins 86, 87 which rise from the body and are received in two apertures in the chassis. A certain amount of angular movement of the chassis is accomplished by means of two set screws 88, 89 shown in FIG. 7 which enable the chassis to be angularly moved a bit so as to make an axial movement of the delivery point at the end of arm 90 on the article delivery member. It will now be seen that both coarse and fine positioning means is provided for the article supply member. For axially positioning the coarse means is moving the slide along the base and the fine is adjustment of set screws 88, 89 for cross-wise (lateral) adjustment, the block 77 is first set and locked and then thumb screw 78 is adjusted.

The article delivery means may conveniently be a vibrator delivery type with the usual recirculation means, which feeds the articles up the channel in the arm to the delivery point. The specific type of delivery means is of no importance to the invention, and it can even be hand-fed. The important feature is that the device be adaptable to deliver articles in some prearranged orientation (unless the articles are always to be disc-like) and that the delivery point preferably be adjustably positionable. Of course it is possible to make a machine to produce specific parts in which adjustability of the article supply members and article transfer members is not necessary, because it is a single purpose machine, but the usual practical machine will require adjustability.

Once the article has been delivered to the delivery point it is necessary to transfer it to a deposit point and for this purpose, article transfer members are provided.

FIG. 10 shows a walking beam 100 mounted to the base and driven in an oscillatory mode by a drive means 101 schematically illustrated as a bi-directional stepper motor. The oscillation is in the direction of axis 22, and the distance of oscillation is the distance S.

Article transfer means 45, 46, 47 are schematically shown on the walking beam, it being understood that more or fewer could be provided. Also, transfer positioning means 102, 103, 104 is schematically shown inter-positioned between the article transfer member and the walking beam to adjust the position of the article transfer member along the beam.

FIG. 8 shows article transfer member 45. Because the others are identical they will not be shown in detail. This member is shown mounted by transfer positioning means 102 to walking beam 100. A channel member 105 embraces the walking beam and is held in a roughly adjusted location along the walking beam by set screw 106.

A cross slide assembly 107 which needs no detailed description here is placed atop channel member 105. Suffice it to say it has a pair of crossed dovetail slides and a pair of lead screws 108, 109 which will finely position the article transfer member in two dimensions. If desired one could rely on set screw 106 for the axial adjustment but often a finer adjustment will be desired and this can be provided by the two sets. In any event, adjustment toward and away from the walking beam is necessary in order to adjust the deposit point of the article transfer member relative to the conveyor means and walking beam. For this purpose cross slide 110 will be provided on any adjustable machine.

The article transfer member has a plunger 115 for up and down vertical movement. This plunger has a tip 116 with a pick up port 117 where an article 118 is picked up, and from which it is deposited. This port connects to an inside passage 119 in the plunger, and this passage extends to a side port 120.

The plunger fits within a cylinder 121 which is cylindrical and smooth. The cylinder is pierced by a port 122 leading to a pick up control line 123. Two seals 124, 125 are fitted around the plunger. They behave as pistons, sliding up and down in cylinder 121 along with the plunger. Their upper position is shown in solid line and their lower position is shown in dashed line. It will be observed that port 122 always stands between the two seals whatever their position. These seals make a fluid sealing fit with the outer wall of the plunger, and in the case of seal 124 it may be desirable to provide a pair of O-rings 126, 127 and a back-up ring 128 if desired. It will now be seen that vacuum or pressure from line 123 can always be transmitted to port 117 at the tip of the plunger. When suction is applied, the article can be pulled against and held against tip 116 so the article can be transferred. When pressure is released the article will be released, and it may be desirable to provide air pressure for this purpose. A suitable selector valve 129 is provided for the purpose of connecting line 123 to vent 130 or a source of higher than atmospheric pressure, and to a vacuum source 131.

Vertical movement of the plunger is accomplished by motor means 135 at its top end. This motor means is a typical piston-cylinder device having a piston 136 fitted in a cylinder 137. The cylinder is a smooth walled cylindrical bore and the piston is a cylindrical piston rigidly and sealingly attached to the plunger. The plunger in this region, for purposes yet to be described, includes a plurality of splines 138. The piston is suitably fitted to it sometimes with additional sealing means. In fact a relatively flexible flap-type seal can advantageously be placed around the plunger adjacent to the pistons at all places where leakage is possible.

A power port 139 enters the cylinder above the piston and leads to a power line 140. A thrust bearing 141 is provided in the cap 142 of the cylinder where it is suitably retained, and can be borne against by the upper end of the plunger when it is in its uppermost position. A suitable selector valve 145 is placed in the power line and lead to a source of actuating fluid, such as pressure and vacuum sources 146, 147 respectively, for controlling the upward and downward movement of the plunger. Of course the plunger may be permitted to descend of its own weight with the motor vented, or as a function of controlled leakage into the cylinder instead of by the application of a direct greater than atmospheric pressure. In any event, piston 136 is rigidly attached to the plunger and a suitable differential pressure will draw it and the plunger upwardly. The nonsealed portions of the device will be appropriately vented, such as beneath the lowermost position of piston 125, just above piston 124. Persons skilled in the art will recognize that it would be equally possible to reverse the connections and apply the power line 141 below the piston, reversing the connections, and the result would be identical. In any event, the operation of motor means 135 will raise and lower the plunger and its tip, so that it will be able to move between the elevations of the delivery point and the deposit point and also to the upper elevation shown in FIG. 2 by arrow 49 for axial movement. The illustrated position in FIG. 8 is the uppermost position occupied during the movement along the path of arrow 49, and the article is shown held by the article for transfer. The position when the pick up actually occurs and when the deposit occurs are of course both below the position illustrated.

Bi-directional rotational means 150 may also be provided in solid line in FIG. 8 for rotating the article. For this purpose, a gear 151, preferably in the form of a rack gear, is axially slideable in a cross block 152 mounted to body 153 of the article transfer member. A motor 154, preferably a piston cylinder type, comprises a cylinder 155, a piston 156, and a rod 157. The rod is attached to the rack so that axial movement of the piston is translated into movement of the rack, which because of its engagement with the splined portion of the plunger as shown in FIG. 9, will rotate it to a desired position. This desired position is selected by adjusting set screw 158. The direction of rotation can be selected by means of a selector valve 160 connectable either to pressure or vacuum 161 or 162 as desired, and presetting the position of the rack means toward one end or the other of its travel. Body 152 acts as a stop for leftward movement in FIG. 8. Optionally, spring bias means can be provided. The operation and construction of this device and of its equivalence will readily be understood by a person skilled in the art.

In a device where accurate positioning of articles is the objective, reduction of internal friction in the system is of serious importance. For this reason, all cylinder surfaces herein have finely finished cylindrical glass surfaces, and all of the pistons are made of graphite. This is an extremely low friction combination, so that the device can operate with a minor usage of compressed air or vacuum, and at very low flow rates, and small differential pressures. For example, when the tip is lowered on the article it should lower gently. If the device is relatively light-weight, then lower friction is essential.

Persons skilled in the art will have no difficulty either in cycling the various valves and stepper systems manually in their proper sequence, or of providing cam or other sequential controls so that the system operates automatically as described. Similarly, it will be seen that both the article supply members and article transfer members are adjustable in their positions so that the dimension S is properly related to a deposit point on the substrate. By way of background, the substrates usually have some surface which is relatively tacky, so that when the article is deposited on its surface, it adheres and the tip moves away with no hesitation and without moving or disturbing the position of the article which it deposited, even if the vacuum were not relieved, or were only partially relieved.

This invention thereby constitutes a device where substrates can be stepped through a single machine, sequentially to receive various articles which can be identical or different and which are deposited in different pre-selected locations on the substrate. The production rate can be very rapid, and the positioning is very accurate. If desired, fail safe means can be provided to indicate whether or not an article has been picked up by the article transfer means, and to shut the system down if it is not. The stepping of the conveyor means can take place while the article transfer means is returning to the delivery point, and while articles are being picked up and moved toward the deposit point. This will speed up the output of the machine. It is only necessary that the substrates be properly located when the article is deposited.

This invention is not to be limited by the embodiments shown in the drawings and described in the description, which are given by way of example and not of limitation, but only in accordance with the scope of the appended claims.

I claim:

1. An article placement system for applying a plurality of articles to a substrate, each article being placed at a different location on said substrate, said system comprising:
   a base;
   a walking beam mounted to the base, said walking beam having an axis of bi-directional movement, and a dimension of length along said axis;
   a plurality of article transfer members mounted to said walking beam at axially spaced-apart locations from one another;

conveyor means extending axially beneath said article transfer members for conveying substrates to positions beneath successive ones of said article transfer means;

a plurality of article supply members, each having a respective delivery point where it provides an article to a respective one of said article transfer members;

drive means axially bi-directionally moving said walking beam, and thereby all of the article transfer members simultaneously by a unit distance, between a respective delivery point and a respective deposit point and reversely;

stepper means intermittently moving said conveyor means by an indexing distance, whereby to move all substrates simultaneously beneath successive deposit points;

supply positioning means mounting each said article supply member to the base whereby its respective delivery point is axially and laterally adjustable;

transfer positioning means mounting each said article transfer member to said walking beam for axial and lateral adjustment to meet the respective delivery point;

whereby said stepper means intermittently operates to cause the conveyor means to move the substrates beneath successive deposit points, and the walking beam oscillates to move the article transfer means from the delivery point of their respective article supply member where they pick up an article, to their respective deposit point where they deposit it.

2. An article placement system according to claim 1 in which said article transfer means includes a pick up element, said pick up element being adapted to engage and release respective articles, and to move vertically to raise and lower said articles.

3. An article placement system according to claim 2 in which said pick up element comprises a rod having a respective axis, said rod being movable along said axis; and motor means for moving said rod along its said axis.

4. An article placement system according to claim 3 in which said rod has a tip, and a passage extending to and opening onto said tip, said passage being adapted to be connected to suction pressure to cause an article to be engaged by the rod, and disconnected therefrom to release the article.

5. An article placement system according to claim 4 in which said passage extends axially in the rod, and has a side-tapped port, and in which a pair of seals seal against said rod on axially opposite sides of said side-tapped port.

6. An article placement system according to claim 3 in which said motor means comprises a piston-cylinder assembly operatively engaged to said rod, and means for exerting fluid pressure on said assembly for moving said rod along its axis.

7. An article placement system according to claim 2 in which said pick up element is rotatable to determine the angular position of the article on the substrate.

8. An article placement system according to claim 7 in which said pick up element comprises a rod having a respective axis, said rod being movable along said axis; and motor means for moving said rod along its said axis.

9. An article transfer system according to claim 8 in which said rod includes axial splines, and in which rotation means comprises gear means engageable to said splines which enable axial movement of said rod, and which can rotate the rod.

10. An article transfer system according to claim 9 in which said gear means comprises a rack, and in which means is provided to move the rack to rotate the rod.

11. An article transfer system according to claim 10 in which stop means is provided to limit the movement of the rack, and thereby establish a rotary position of the rod.

12. An article transfer system according to claim 9 in which said rod terminates at its upper end at a ball-type thrust bearing.

13. An article transfer system according to claim 5 in which said seals, and the piston in said motor, are graphite, and in which the surfaces they engage are glass.

* * * * *